United States Patent
Bollenbeck

(12) 
(10) Patent No.: US 6,549,068 B1
(45) Date of Patent: Apr. 15, 2003

(54) SYSTEM AND METHOD FOR OPERATING AN RF POWER AMPLIFIER

(75) Inventor: Jan Bollenbeck, Munich (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 10/049,017

(22) PCT Filed: Apr. 13, 2000

(86) PCT No.: PCT/DE00/01167
§ 371 (c)(1),
(2), (4) Date: May 16, 2002

(87) PCT Pub. No.: WO01/11768
PCT Pub. Date: Feb. 15, 2001

(65) Prior Publication Data (65)

(30) Foreign Application Priority Data

Aug. 10, 1999 (DE) .......................... 199 37 750

(51) Int. Cl.⁷ .............................. H03G 3/20; H03G 3/10
(52) U.S. Cl. .................. 330/129; 330/141; 330/279; 330/284
(58) Field of Search ................. 330/129, 140, 330/141, 144, 279, 281, 284

(56) References Cited

U.S. PATENT DOCUMENTS

| 4,234,853 A | * | 11/1980 | Yamaguchi | 330/280 |
| 5,426,641 A | | 6/1995 | Afrashteh et al. | |
| 5,740,524 A | * | 4/1998 | Pace et al. | 330/136 |
| 5,872,481 A | * | 2/1999 | Sevic et al. | 330/51 |
| 6,069,866 A | * | 5/2000 | Pietruszynski et al. | 330/254 |

FOREIGN PATENT DOCUMENTS

WO    WO 98/25339    6/1998

OTHER PUBLICATIONS

XP000601707–"Improving the Power–Added Efficiency of FET Amplifiers Operating with Varying–Envelope Signals." c.1983.

* cited by examiner

Primary Examiner—Patricia T. Nguyen
(74) Attorney, Agent, or Firm—Morrison & Foerster, LLP

(57) ABSTRACT

Method for operating an RF power amplifier (100; 200) with an approximately linear characteristic by adjusting at least one operating parameter of the amplifier or at least one active component of this amplifier, wherein a minimum collector or drain current of the active component or, respectively, an amplifier stage and the input signal level of the RF power amplifier are controlled in dependence on the quotient of harmonic power and useful-signal power of the amplifier output signal.

12 Claims, 2 Drawing Sheets

SYSTEM AND METHOD FOR OPERATING AN RF POWER AMPLIFIER

This application claims priority to International Application No. PCT/DE00/01167 which was published in the German language on Feb. 15, 2001.

TECHNICAL FIELD OF THE INVENTION

The invention relates to a method for operating an RF power amplifier, particularly a mobile radio transmitting output stage, according to the preamble of claim 1, and an arrangement for carrying out this method.

BACKGROUND OF THE INVENTION

Mobile voice and data communication is a technical field which is developing extremely rapidly and has a very wide economic perspective. Utilization of this perspective presupposes the continuously improved utilization of the available frequency resources and the opening up of possibilities for transmitting ever increasing volumes of data with the required reliability.

When new standards are established which must take into account these requirements, the use of modulation methods with an inconstant envelope curve, for example of combined phase and amplitude modulation methods, is defined, differently from the current GSM standard, for example. Thus, the use of QPSK (Quadrature Phase Shift Keying) modulation, as an example of such a modulation method, is provided for the UMTS (Universal Mobile Telecommunication System) standard which determines the near future of mobile technology.

RF signals modulated in this manner must be amplified—for example in the transmitting output stage of a mobile radio terminal—with high accuracy and without distortion, i.e. free of amplitude distortion due to non-linearities of the amplifier characteristic and free of phase distortion which is caused by the AM-to-PM conversion process. This is because the digital modulation methods defined in the mobile radio standards of the future, for example the above-mentioned UMTS standard, are extremely sensitive to distortion-related bit errors. The system standards or specifications, therefore, contain strict rules with regard to the permissible amplitude and phase errors and the permissible adjacent channel power (ACP).

The error limits and adjacent channel powers specified in the specifications can only be maintained with high-quality linear transmit amplifiers or by using additional equalizing circuits for linearizing the transmission characteristic. The linear operation of a Class A amplifier presupposes that the 1-dB output compression point of the amplifier is clearly above the peak power level of the output signal. This requirement must be taken into consideration in the design of all amplifier stages and bias currents. Such a design of the amplifier for maximum output power to be provided results in an unnecessarily high current consumption at low power levels. The efficiency of the amplifier thus drops rapidly with decreasing output power level. This presents a serious utility value disadvantage for the user because it entails an unnecessarily high current consumption and thus relatively short charging cycles for the battery of the mobile radio terminal. This is particularly serious in future devices according to the UMTS standard because the transmitter of these devices is continuously operated in so-called full duplex mode.

Additional known measures for linearizing the transmission characteristic of an amplifier arrangement which is non-linear per se include, for example, a pre-emphasis of the modulated signal by means of which the non-linear transmission characteristic of the actual amplifier is replicated inversely so that the superposition of the actual transmission characteristic of the amplifier and the inversely replicated amplitude response of the modulated signal results in an approximately linear transfer function overall. Like other measures of a similar type, this measure, however, is relatively expensive to implement electronically and only provides for a real linearization of the overall transmission characteristic up to a certain degree.

It is also known to compare the current consumption of individual transistor stages with a nominal quantity which depends on the expected-output power and to correct the transistor operation points in dependence on the result of the comparison, with the aim of linearizing an amplifier characteristic.

To suppress any unwanted side effect of non-linearities of the amplifier characteristic of the transmit amplifier—namely the widening of the transmit frequency spectrum by intermodulation effects (mainly of the third order)—it is also known to separate the intermodulation products from the total signal as an error signal by means of a comparison of input and output signal and by suitable amplitude and phase adjustment at the output of the comparator. The error signal thus ascertained can then be applied via suitable coupling elements to the input of the amplifier to be linearized in order to achieve intermodulation feedback (or to its output in order to achieve a feed forward). However, this is an additional measure which can only minimize an effect of the abovementioned non-linearities.

SUMMARY OF THE INVENTION

In one embodiment of the invention there is a method for operating an RF power amplifier with an approximately linear characteristic. The method includes, for example, adjusting at least one operating parameter of the amplifier or at least one active component of the amplifier, and controlling a minimum collector or drain current of the active component, or an amplifier stage and an input signal level of the RF power amplifier, based on a quotient of harmonic power and useful-signal power of the amplifier output signal.

In another aspect of the invention, the input signal level is controlled as power control by means of a control loop.

In another aspect of the invention, the input signal level is controlled with access to an allocation rule, between amplification or output signal level values and input signal level values by an input level control unit.

In yet another aspect of the invention, the input level control unit operates based on externally transmitted amplification or output signal level values or amplification or output signal change commands.

In another aspect of the invention, the method includes varying an attenuation of a preceding attenuation section and/or the amplification of a preceding small-signal amplifier for controlling the input signal level.

In another embodiment of the invention, there is an RF power amplifier arrangement, with an approximately linear characteristic. The arrangement includes a bias adjusting unit to adjust a minimum collector or drain current of at least one active component or of an amplifier stage, and an input signal level adjusting unit to adjust the input signal level based on a quotient of harmonic power and useful-signal power of the amplifier output signal.

In another aspect of the invention, the bias adjusting unit comprises a bias control loop and the input signal level adjusting unit comprises a power control loop which is substantially separate from the bias control loop.

In another aspect of the invention, the input signal level adjusting unit includes an input signal level control unit with a storage unit in which an allocation rule between amplification or output signal level values and input signal level values is stored.

In still another aspect of the invention, the input signal level adjusting unit includes a controllable attenuation section or a controllable linear small-signal amplifier.

In another aspect of the invention, the bias adjusting unit includes a high-pass filter and a first power detector, which follows the filter at least indirectly, and the input signal level adjusting unit includes a low-pass filter and a second power detector, which follows the filter at least indirectly.

In another aspect of the invention, the bias adjusting unit, and the input signal level adjusting unit each includes a temperature compensation element.

In yet another aspect of the invention, the bias adjusting unit and/or the input signal level adjusting unit include a reference value providing unit and a comparator or subtraction device which are connected to the comparator or subtraction device latter via an input.

BRIEF DESCRIPTION OF THE DRAWINGS

Advantages and suitabilities of the invention are obtained from the description of preferred exemplary embodiments, referring to the figures, in which.

DETAILED DESCRIPTION OF THE PREFERRED EMBODIMENTS

Figure 1:
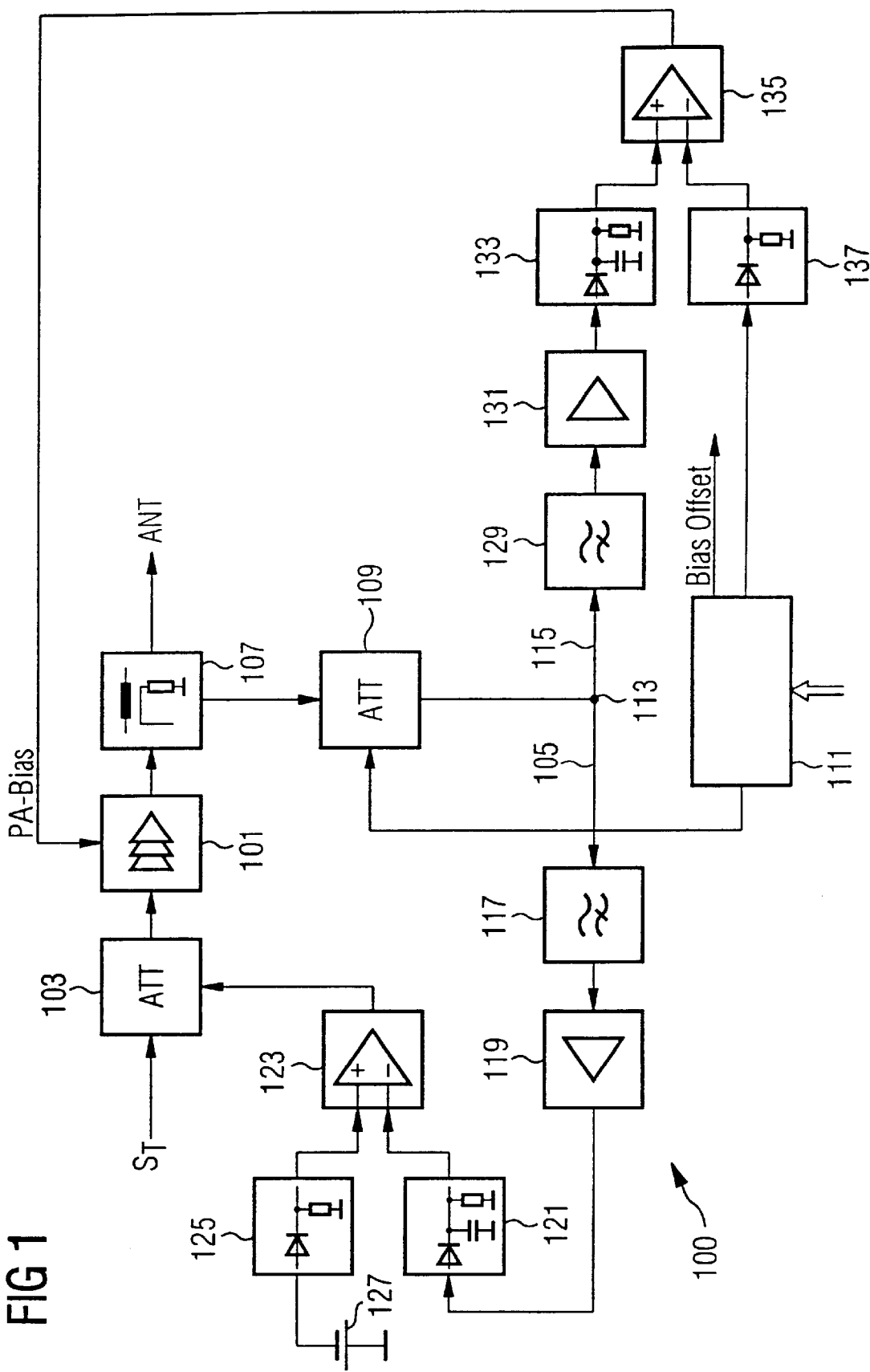
FIG. 1 shows a diagrammatic representation for explaining a first embodiment of the invention in the form of a functional block diagram.

In one embodiment of the invention, there is a method for operating an RF power amplifier with an approximately linear characteristic and a corresponding circuit arrangement which can be implemented with supportable expenditure.

It is the object of the invention, therefore, to specify an effective method for operating an RF power amplifier with an approximately linear characteristic and a corresponding circuit arrangement which can be implemented with supportable expenditure.

This object is achieved by a method with the features of claim 1 with regard to its method aspect and by an arrangement with the features of claim 6 with regard to its device aspect.

According to one aspect, the invention includes adjusting the collector or drain current of the transistors or stages of the RF power amplifier, respectively, to a minimum value which guarantees that the applicable linearity requirements are met. Furthermore, it includes controlling the output signal level via a variation of the input signal level. Additionally, the invention includes using the quotient of the harmonic power and useful-signal power of the output signal as an assessment criterion.

An operation point of the RF power amplifier which is optimized to a high efficiency can be permanently maintained independently of the output power to be provided. As a result, the current consumption can be distinctly reduced, especially with low modulation, and thus the charging cycle time, for example, for the batteries of a mobile telephone can be noticeably extended.

In a preferred embodiment, the input signal level is controlled as "traditional" power control by means of a control loop.

Using the principle proposed here, an operation point of the RF power amplifier which is optimized to a high efficiency can be permanently maintained independently of the output power to be provided. As a result, the current consumption can be distinctly reduced, especially with low modulation, and thus the charging cycle time, for example, for the batteries of a mobile telephone can be noticeably extended.

In a preferred embodiment of this proposed solution, the input signal level is controlled as "traditional" power control by means of a control loop.

In another advantageous embodiment, the input signal level is controlled by a special control unit with access to an allocation rule, stored in the form of a table, between amplification or output signal level values and input signal level values. Such an implementation presupposes the existence of corresponding storage and processing means but is easily possible in a microprocessor-controlled device such as a mobile telephone.

In still another embodiment, the control of the input signal level can also be effected on the basis of control signals which are supplied to the transmitting device from the outside—for example as "downlink closed-loop power control" according to the UMTS standard, a command for adjusting the transmit power level (decrease or increase by a certain amount or factor) being periodically transmitted to the mobile telephone by the base station.

The process of changing the input signal level can proceed, in particular, as a variation of the attenuation of an attenuation section preceding the amplifier input.

A control loop which is separate from the abovementioned power control loop is advantageously used for adjusting bias or collector/drain current.

Figure 2:
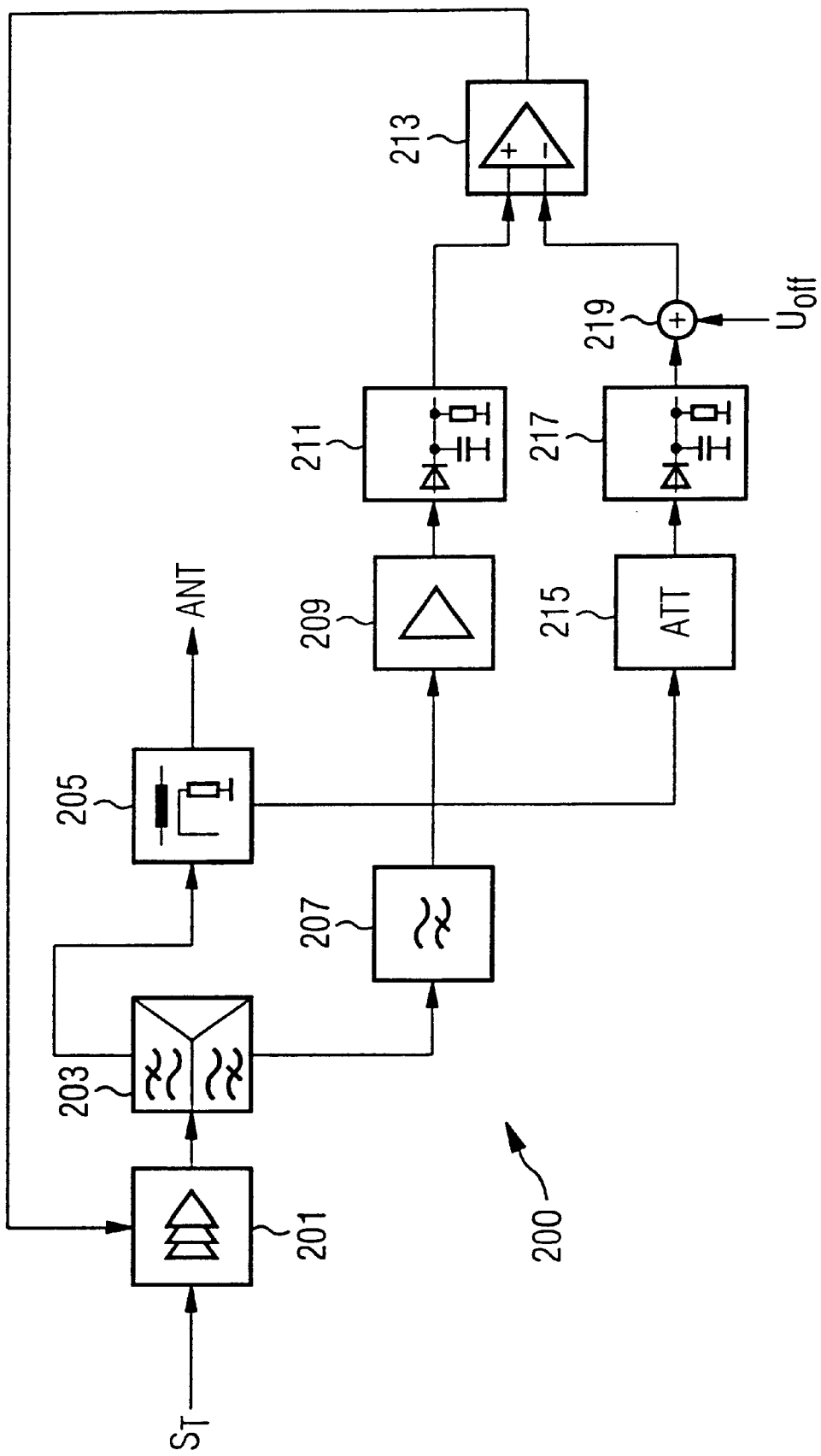
FIG. 2 shows a diagrammatic representation for explaining a second embodiment of the invention, in the form of a functional block diagram.

FIG. 1 shows a diagrammatic representation for explaining a first embodiment of the invention in the form of a functional block diagram, and FIG. 2 shows a diagrammatic representation for explaining a second embodiment of the invention, in the form of a functional block diagram.

FIG. 1 shows a transmit amplifier arrangement 100 according to a first exemplary embodiment, the core of which is an RF power amplifier 101 which meets the high linearity a requirements with regard to QPSK modulation of a transmit signal $S_T$.

The RF power amplifier 101 is preceded by a controllable attenuation section 103 which is driven via a power control loop 105 for adjusting the input signal level of the RF power amplifier 101. The RF power amplifier 101 is followed by a directional coupler 107 which extracts a part of the amplifier output power on the signal path to an antenna ANT and supplies it to a further controllable attenuation section 109. The attenuation of the controllable attenuation section log is adjusted via a control unit 111, which will be explained in greater detail below. After passing through the attenuation section 109, the extracted part of the amplifier output signal reaches a node 113 which forms a branch point between the power control loop 105 and a bias control loop 115.

The RF power amplifier 101 is preceded by a controllable attenuation section 103 which is driven via a power control loop 105 for adjusting the input signal level of the RF power amplifier 101. The RF power amplifier 101 is followed by a directional coupler 107 which extracts a part of the amplifier output power on the signal path to an antenna ANT and supplies it to a further controllable attenuation section 109. The attenuation of the latter is adjusted via a control unit 111 which will be explained in greater detail below. After passing through the attenuation section 109, the extracted part of the amplifier output signal reaches a node 113 which forms a branch point between the power control loop 105 already mentioned above, and a bias control loop 115.

In the power control loop 105, the node 113 is (optionally) followed by a low-pass filter 117 which is followed by a linear small-signal amplifier 119. The output of the small-signal amplifier or linear amplifier 119 is connected to a power detector 121, the output of which is connected to the inverting input of an operational amplifier 123 acting as control amplifier. The non-inverting input of the operational amplifier 123 is connected to a temperature compensation element 125, the input of which is connected to a reference voltage source 127. The output signal of the operational amplifier 123 forms the control signal for adjusting the variable attenuation of the attenuation section 103.

In the bias control loop 115, the node 113 is followed by a high-pass filter 129 which is followed by a linear amplifier 131, the output of which is connected to a power detector 133. The output of the linear amplifier 131 is connected to the inverting input of an operational amplifier (control amplifier) 135, the non-inverting input of which is connected to another temperature compensation element 137. The temperature compensation element 137 receives from the control unit 111 a bias offset voltage which is derived—analogously to how the control signal for the variable attenuation section 109 is obtained—from an allocation, stored in table form in the control unit 111, between bias offset values (or attenuation values for adjusting the attenuation section) and output signal levels to be adjusted.

Due to the power control, a signal with a constant useful power level (apart from the envelope curve fluctuation due to the amplitude modulation of the output signal) is present at the node 113. After linear amplification, the harmonic power of this signal, obtained by subsequent high-pass filtering in the filter 129, is subjected to power detection, the result of which is an actual voltage which is compared with a nominal voltage generated in the control unit 111. The operation point of the RF power amplifier 101 is corrected via the control signal obtained as a result of the comparison (the output signal of the control amplifier 135), in such a manner that the RF power amplifier operates with a sufficiently linear characteristic.

A quiescent current (or, respectively, collector or drain current), below which the current cannot drop even with low modulation of the RF power amplifier, can be adjusted via the control unit 111. In the embodiment shown in the figure, this control quantity "bias offset" acts in the control loop but it can also be supplied directly to the power amplifier in an alternative embodiment. In the design of the bias control loop, attention should be paid to a bandwidth which meets the system requirements.

The ratio between harmonic power and useful-signal power (which directly characterizes the linearity of the RF power amplifier 101) is matched dynamically to the requirements specified in the system specifications via the control loop 105 in dependence on the output power set in each case.

FIG. 2 shows a transmit amplifier arrangement 200 in a modified embodiment which provides for operation of an output stage bias control which is independent of a power control. An RF power amplifier 201 is again fed here a QPSK-modulated transmit signal $S_T$ and the amplified output signal is supplied to a diplexer 203 which is again followed by a directional coupler 205 in the signal path to an antenna ANT. The diplexer 203 in this case acts as a harmonic filter for the output signal and provides for constant impedance matching of the amplifier output for frequencies far above the useful frequency, largely independently of the terminating impedance at the second output terminal of the diplexer.

The diplexer 203 is connected via this second output terminal via a high-pass filter 207 to the input of a linear amplifier 209, the output signal of which is supplied to a power detector 211 which determines the harmonic power component of the output signal of the RF power amplifier 201. The output signal of the power detector 211 is supplied to the non-inverting input of an operational amplifier (control amplifier) 213, the output signal of which forms the control signal for controlling the RF power amplifier 201.

The inverting input of the operational amplifier 213 is supplied with a signal component of the useful signal with attenuated harmonics, which is primarily branched off by the directional coupler 205 and which passes via an attenuation section 215 to a further power detector 217 which determines the useful-power component of the total output signal of the RF amplifier 201. The power detector 217 is followed by an adder 219 which can be supplied with an offset voltage $U_{off}$ (again taken from an allocation table, for example) for matching the signal/harmonics ratio.

In this arrangement, the ratio of harmonic power to useful power which is used as assessment criterion for the amplifier adjustment, is determined via the ratio of the gain of the component chains diplexer 203—directional coupler 205—attenuation section 215—power detector 217 (useful-signal power) and diplexer 203—high-pass filter 207—linear amplifier 209—power detector 211 (harmonic power).

In an embodiment modified compared with FIG. 2, the adder 219 is omitted and instead, the attenuation section 215 is designed as a controllable attenuation section, the attenuation of which can be changed via a control voltage (corresponding to $U_{off}$) In this arrangement, the power detectors 211, 217 are always operated at the same DC and RF operation point.

The embodiment of the invention is not restricted to the examples described above but is possible in a multiplicity of variations which are within the scope of expert action.

What is claimed is:

1. A method for operating an RF power amplifier with an approximately linear characteristic, comprising:
    adjusting at least one operating parameter of the amplifier or at least one active component of the amplifier; and
    controlling a minimum collector or drain current of the active component, or an amplifier stage and an input signal level of the RF power amplifier, based on a quotient of harmonic power and useful-signal power of the amplifier output signal.

2. The method as claimed in claim 1, wherein the input signal level is controlled as power control by means of a control loop.

3. The method as claimed in claim 1, wherein the input signal level is controlled with access to an allocation rule, between amplification or output signal level values and input signal level values by an input level control unit.

4. The method as claimed in claim 3, wherein the input level control unit operates based on externally transmitted amplification or output signal level values or amplification or output signal change commands.

5. The method as claimed in claim 1, further comprising varying an attenuation of a preceding attenuation section and/or the amplification of a preceding small-signal amplifier for controlling the input signal level.

6. An RF power amplifier arrangement, with an approximately linear characteristic, comprising:
- a bias adjusting unit to adjust a minimum collector or drain current of at least one active component or of an amplifier stage; and
- an input signal level adjusting unit to adjust the input signal level based on a quotient of harmonic power and useful-signal power of the amplifier output signal.

7. The RF power amplifier arrangement as claimed in claim 6, wherein the bias adjusting unit comprises a bias control loop and the input signal level adjusting unit comprises a power control loop which is substantially separate from the bias control loop.

8. The RF power amplifier arrangement as claimed in claim 6, wherein the input signal level adjusting unit includes an input signal level control unit with a storage unit in which an allocation rule between amplification or output signal level values and input signal level values is stored.

9. The RF power amplifier arrangement as claimed in claim 6, wherein the input signal level adjusting unit includes a controllable attenuation section or a controllable linear small-signal amplifier.

10. The RF power amplifier arrangement as claimed in claim 6, wherein the bias adjusting unit includes a high-pass filter and a first power detector, which follows the filter at least indirectly, and the input signal level adjusting unit includes a low-pass filter and a second power detector, which follows the filter at least indirectly.

11. The RF power amplifier arrangement as claimed in claim 6, wherein the bias adjusting unit, and the input signal level adjusting unit each includes a temperature compensation element.

12. The RF power amplifier arrangement as claimed in claim 6, wherein the bias adjusting unit and/or the input signal level adjusting unit include a reference value providing unit and a comparator or subtraction device which are connected to the comparator or subtraction device latter via an input.

* * * * *